United States Patent
Tai et al.

(10) Patent No.: US 12,550,578 B2
(45) Date of Patent: Feb. 10, 2026

(54) ELECTRONIC DEVICE INCLUDING SUB-PIXELS

(71) Applicant: InnoLux Corporation, Miao-Li County (TW)

(72) Inventors: Ming-Jou Tai, Miao-Li County (TW); Chia-Hao Tsai, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 18/914,278

(22) Filed: Oct. 14, 2024

(65) Prior Publication Data

US 2025/0151564 A1    May 8, 2025

(30) Foreign Application Priority Data

Nov. 7, 2023   (CN) .......................... 202311464398.X

(51) Int. Cl.
*H10K 59/131*    (2023.01)
*H10K 59/121*    (2023.01)
*H10K 59/35*     (2023.01)

(52) U.S. Cl.
CPC ....... *H10K 59/353* (2023.02); *H10K 59/1213* (2023.02); *H10K 59/131* (2023.02)

(58) Field of Classification Search
CPC ............. H10K 59/353; H10K 59/1213; H10K 59/131; H10K 59/121; H10K 59/352; H10K 59/65; H10K 59/88
See application file for complete search history.

(56) References Cited

U.S. PATENT DOCUMENTS

| | | | |
|---|---|---|---|
| 7,719,780 B2 | 5/2010 | Wang | |
| 8,164,605 B2 | 4/2012 | Hsieh | |
| 9,887,247 B2 | 2/2018 | Yang | |
| 2013/0314389 A1* | 11/2013 | Wang | G09G 3/3648 345/211 |
| 2019/0051245 A1* | 2/2019 | Jun | G09G 3/3233 |
| 2019/0181191 A1* | 6/2019 | Chen | H10K 59/121 |
| 2020/0043989 A1* | 2/2020 | Liu | H10K 59/353 |
| 2021/0359029 A1* | 11/2021 | Feng | G09G 3/3208 |
| 2022/0044636 A1* | 2/2022 | Mou | G09G 3/3258 |

FOREIGN PATENT DOCUMENTS

| | | |
|---|---|---|
| TW | 201040906 A1 | 11/2010 |
| TW | I334119 B | 12/2010 |

* cited by examiner

*Primary Examiner* — Pegeman Karimi
(74) *Attorney, Agent, or Firm* — Winston Hsu

(57) ABSTRACT

An electronic device including a substrate and a plurality of sub-pixels is disclosed. The plurality of sub-pixels are disposed on the substrate and arranged along a first direction and a second direction, and the first direction is different from the second direction. One of the plurality of sub-pixels has a first width in the first direction and a second width in the second direction, and a ratio of the first width to the second width is greater than 0.66 and less than 1.5.

20 Claims, 13 Drawing Sheets

ELECTRONIC DEVICE INCLUDING SUB-PIXELS

BACKGROUND OF THE DISCLOSURE

1. Field of the Disclosure

The present disclosure relates to an electronic device, and more particularly to an electronic device including a plurality of sub-pixels.

2. Description of the Prior Art

With the progress of science and technology, electronic devices have become indispensable items in modern life. In electronic devices such as virtual reality (VR) devices and liquid crystal display devices, it is not easy for products having pixels with a small size to improve the resolution due to the limit of the production machine.

SUMMARY OF THE DISCLOSURE

One of objectives of the present disclosure is to provide an electronic device, so as to improve the resolution, process feasibility and/or product yield of the electronic device through the specific design and arrangement of the sub-pixels, or the effect of saving electrical power may be achieved.

The present disclosure provides an electronic device including a substrate and a plurality of sub-pixels. The plurality of sub-pixels are disposed on the substrate and arranged along a first direction and a second direction, and the first direction is different from the second direction. One of the plurality of sub-pixels has a first width in the first direction and a second width in the second direction, and a ratio of the first width to the second width is greater than 0.66 and less than 1.5.

These and other objectives of the present disclosure will no doubt become obvious to those of ordinary skill in the art after reading the following detailed description of the embodiment that is illustrated in the various figures and drawings.

DETAILED DESCRIPTION

Figure 1:
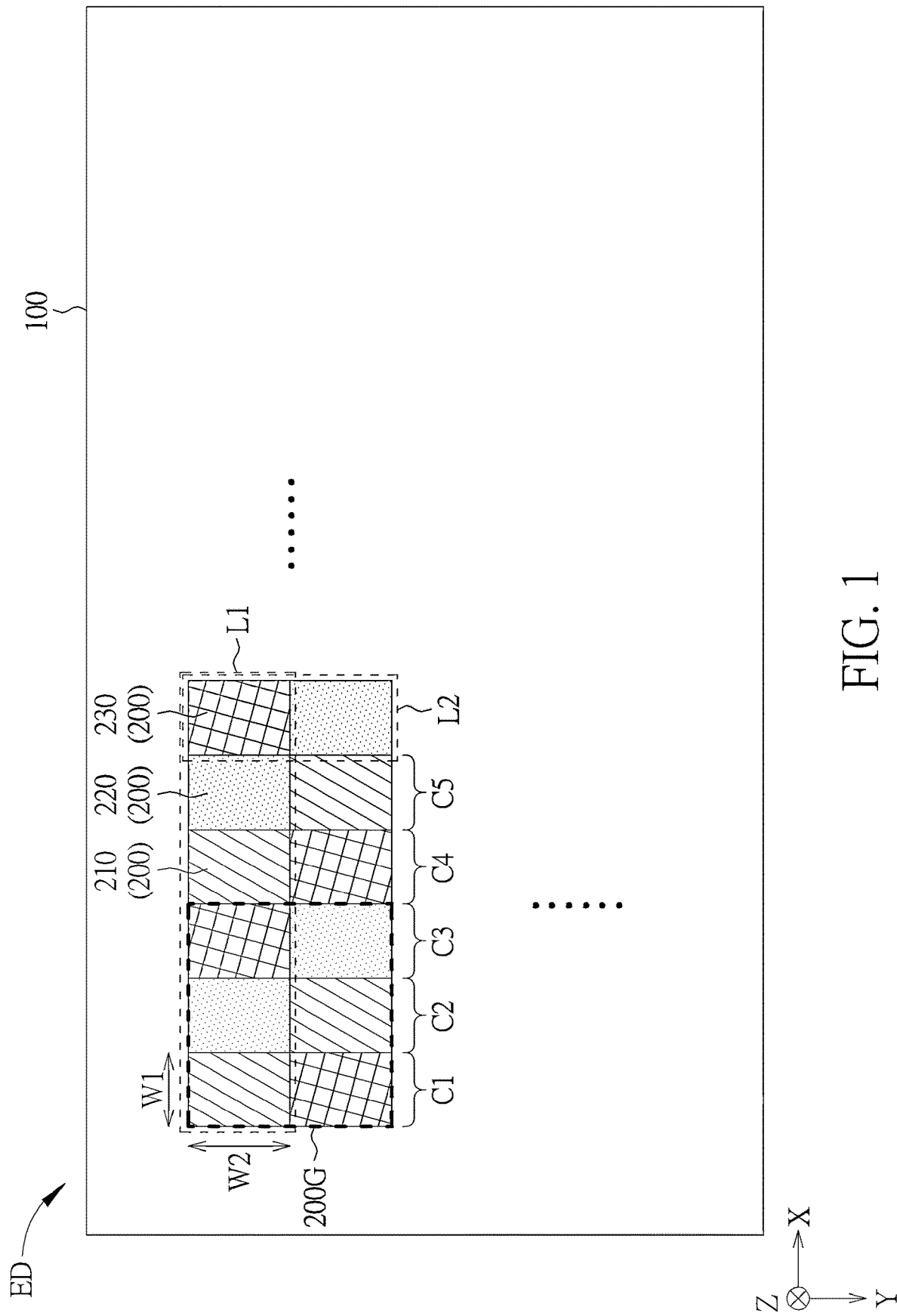
FIG. 1 is a partial top-view schematic diagram of an electronic device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of the device or structure, and certain components in various drawings may not be drawn to scale. In addition, the number and dimension of each component shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". When the terms "include", "comprise" and/or "have" are used in the description of the present disclosure, the corresponding features, areas, steps, operations and/or components would be pointed to existence, but not limited to the existence or addition of one or a plurality of the corresponding or other features, areas, steps, operations, components and/or combinations thereof.

When an element or layer is referred to as being "on" or "connected to" another element or layer, it may be directly on or directly connected to the other element or layer, or intervening elements or layers may be presented (indirect condition). In contrast, when an element is referred to as being "directly on" or "directly connected to" another element or layer, there are no intervening elements or layers presented.

The directional terms mentioned in this document, such as "up", "down", "front", "back", "left", "right", etc., are only directions referring to the drawings. Therefore, the directional terms used are for illustration, not for limitation of the present disclosure.

The ordinal numbers used in the description and claims, such as "first", "second", "third", etc., are used to describe elements, but they do not mean and represent that the element(s) have any previous ordinal numbers, nor do they represent the order of one element and another element, or the order of manufacturing methods. The ordinal numbers are used only to clearly discriminate an element with a certain name from another element with the same name. The claims and the description may not use the same terms.

Accordingly, in the following description, a first constituent element may be a second constituent element in a claim.

The terms "equal", "identical" or "the same", and "substantially" or "approximately" generally mean being within 20% of a given value or range, or being within 10%, 5%, 3%, 2%, 1% or 0.5% of a given value or range.

The electronic device of the present disclosure may be applied to a display device, a light-emitting device, a backlight device, a virtual reality device, an augmented reality device, an antenna device, a sensing device or a tiled device, but not limited herein. The electronic device may include a bendable or flexible electronic device. The electronic device may include, for example, liquid crystal, light-emitting diodes (LEDs), fluorescence, phosphors, other suitable display media or combinations of the above, but not limited herein. The display device may include a non-self-emissive display device or a self-emissive display device. The antenna device may include a liquid-crystal type antenna device or an antenna device other than liquid-crystal type, and the sensing device may include a sensing device used for sensing capacitance, light, heat or ultrasonic waves, but not limited herein. The electronic device may include electronic elements such as passive elements and active elements, for example, capacitors, resistors, inductors, diodes, transistors, etc. The diode may include a light-emitting diode or a photodiode. For example, the light-emitting diode may include an organic light-emitting diode (OLED), a mini light-emitting diode (mini LED), a micro light-emitting diode (micro LED) or a quantum dot light-emitting diode (quantum dot LED), but not limited herein. The tiled device may be, for example, a display tiled device or an antenna tiled device, but not limited herein. It should be noted that the electronic device may be any arrangement and combination of the above, but not limited herein. The electronic device may have a peripheral system such as a driving system, a control system, a light source system, etc., to support a display device, an antenna device, a wearable device (including an augmented reality device or a virtual reality device, for example), a vehicle-mounted device (including an automobile windshield, for example) or a tiled device.

It should be noted that the technical features in different embodiments described in the following can be replaced, recombined, or mixed with one another to constitute another embodiment without departing from the spirit of the present disclosure.

Please refer to FIG. 1, which is a partial top-view schematic diagram of an electronic device according to a first embodiment of the present disclosure. As shown in FIG. 1, an electronic device ED includes a substrate 100 and a plurality of sub-pixels 200, and the plurality of sub-pixels 200 are disposed on the substrate 100. The plurality of sub-pixels 200 may be disposed in a working region (or referred to an active region) of the electronic device ED. When the electronic device ED includes a display panel or the electronic device ED is a display device, the working region is, for example, a display region, but not limited herein. The plurality of sub-pixels 200 are arranged along a direction X (which may be referred to a first direction) and a direction Y (which may be referred to a second direction), and the direction X is different from the direction Y. For example, the direction X may be perpendicular to the direction Y, but not limited herein. One of the plurality of sub-pixels 200 has a first width W1 in the direction X and a second width W2 in the direction Y, wherein a ratio of the first width W1 to the second width W2 is greater than 0.66 and less than 1.5 (i.e., 0.66<W1/W2<1.5), or the relative widths of each sub-pixel 200 in the direction X and the direction Y may all meet the above range in some embodiments. For example, the ratio of the first width W1 to the second width W2 may be 1.5:2, that is, the ratio of the first width W1 to the second width W2 may be 0.75, but not limited herein. Through the width design and arrangement of the sub-pixels 200 described above, more sub-pixels 200 may be disposed in the working region of the electronic device ED, that is, the pixels per inch (PPI) may be improved, thereby improving the resolution of the electronic device ED. It should be noted that FIG. 1 only shows the arrangement of a portion of the sub-pixels 200 on the substrate 100 when the electronic device ED is viewed from the top along a direction Z, but more sub-pixels 200 may be disposed on the substrate 100 in practice. The plurality of sub-pixels 200 may be arranged in a plurality of sub-pixel rows extending along the direction X and a plurality of sub-pixel columns extending along the direction Y on the substrate 100, such as (but not limited to) in an array arrangement. The direction Z may be a normal direction of the electronic device ED and parallel to a top-view direction of the electronic device ED and a normal direction of a surface of the substrate 100. That is to say, the direction Z may be perpendicular to an upper surface or a lower surface of the substrate 100, and the direction X and the direction Y may be perpendicular to the direction Z respectively.

According to the embodiment shown in FIG. 1, the first width W1 of the sub-pixel 200 in the direction X is less than the second width W2 of the sub-pixel 200 in the direction Y, so that a number of the sub-pixels 200 disposed in the direction X may be greater than a number of the sub-pixels 200 disposed in the direction Y in the working region of the electronic device ED (taking a length of the working region in the direction X is equal to a length thereof in the direction Y as an example). Specifically, an arrangement of the plurality of sub-pixels 200 may have a first line L1 extending along the direction X and a second line L2 extending along the direction Y, and a number of the sub-pixels 200 in the first line L1 is greater than a number of the sub-pixels 200 in the second line L2. That is to say, the number of the sub-pixels 200 in one row extending along the direction X may be greater than the number of the sub-pixels 200 in one column extending along the direction Y.

The electronic device ED may include at least one scan line (e.g., scan lines GL shown in FIG. 5) and at least one data line (e.g., data lines DL shown in FIG. 5), and the scan line and the data line are disposed on the substrate 100. The scan line GL may generally extend along the direction X, and the data line DL may generally extend along the direction Y. The first width W1 of the sub-pixel 200 may be a distance between the same side-edges of adjacent two data lines or a distance between the center lines of adjacent two data lines. The second width W2 of the sub-pixel 200 may be a distance between the same side-edges of adjacent two scan lines or a distance between the center lines of adjacent two scan lines. For example, as shown in FIG. 1 (which may be cooperated with FIG. 5), the first width W1 of the sub-pixel 200 may be the shortest distance obtained by measuring from an edge of one side (e.g., the left side) of one data line to an edge of the same side (e.g., the left side) of another adjacent data line in the direction X, and the second width W2 of the sub-pixel 200 may be the shortest distance obtained by measuring from an edge of one side (e.g., the lower side) of one scan line to an edge of the same side (e.g., the lower side) of another adjacent scan line in the direction Y, wherein for example (but not limited to), the side-edges of adjacent two scan lines overlapped with the data line in the direction Z may be used as the measurement reference. In some embodiments, the electronic device ED may further include layers and elements disposed on the substrate 100, such as at least one insulating layer, at least one conductive layer and/or thin film transistors (e.g., thin film transistors TFT shown in FIG. 5 or FIG. 13), but not limited herein.

As shown in FIG. 1, the plurality of sub-pixels 200 may include a first sub-pixel 210, a second sub-pixel 220 and a third sub-pixel 230, which may be sub-pixels with different functions, such as sub-pixels representing different colors respectively. For example, the first sub-pixel 210 may be a red sub-pixel, the second sub-pixel 220 may be a green sub-pixel, and the third sub-pixel 230 may be a blue sub-pixel, but not limited herein. When the electronic device ED has a display function, the first sub-pixel 210, the second sub-pixel 220 and the third sub-pixel 230 may represent sub-pixels that can respectively generate light with different colors. For example, the sub-pixels 200 may show different colors by disposing color filters and/or light-emitting elements that can emit light with different colors. A number of sub-pixels 200 may form a pixel. For example, one pixel may include the first sub-pixel 210, the second sub-pixel 220 and the third sub-pixel 230, but not limited herein. According to the embodiment of the present disclosure, the plurality of sub-pixels 200 may be divided into a plurality of pixel groups 200G, and one pixel group 200G (indicated by the thick dotted-line frame shown in FIG. 1) is the smallest repeating unit in the arrangement of the sub-pixels 200. The plurality of pixel groups 200G may be arranged side by side along the direction X and the direction Y on the substrate 100.

Taking the electronic device ED shown in FIG. 1 as an example, a pixel group 200G that is the smallest repeating unit may be composed of two first sub-pixels 210, two second sub-pixels 220 and two third sub-pixels 230. In the pixel group 200G, along the direction X, the first row may include the first sub-pixel 210, the second sub-pixel 220 and the third sub-pixel 230 in sequence, and the second row may include the third sub-pixel 230, the first sub-pixel 210 and the second sub-pixel 220 in sequence, but not limited herein.

In some embodiments, the data lines may be connected to and drive the plurality sub-pixels 200 shown in FIG. 1 in a zigzag manner. For example, one data line may be connected to a portion of the sub-pixels 200 in adjacent two sub-pixel columns. Specifically, an arrangement of the plurality of sub-pixels 200 may have a first sub-pixel column C1, a second sub-pixel column C2, a third sub-pixel column C3, a fourth sub-pixel column C4 and a fifth sub-pixel column C5 extending along the direction Y respectively and arranged side by side with each other in the direction X. One data line may be connected to even-numbered ones of the sub-pixels 200 in the first sub-pixel column C1, that is, the data line may drive the second one of the sub-pixels 200 in the first sub-pixel column C1 (i.e., the third sub-pixel 230 as shown in FIG. 1), and another data line may be connected to odd-numbered ones of the sub-pixels 200 in the first sub-pixel column C1 and even-numbered ones of the sub-pixels 200 in the second sub-pixel column C2, that is, the another data line may drive the first one of the sub-pixel 200 in the first sub-pixel column C1 (i.e., the first sub-pixel 210 as shown in FIG. 1) and the second one of the sub-pixel 200 in the second sub-pixel column C2 (i.e., the first sub-pixel 210 as shown in FIG. 1). The data line drives the sub-pixels 200 with the same color, so that the frequency of the data line switching to different colors may be reduced, thereby achieving the effect of power saving. In addition, still another data line may be connected to odd-numbered ones of the sub-pixels 200 in the second sub-pixel column C2 and even-numbered ones of the sub-pixels 200 in the third sub-pixel column C3 (i.e., in sequence, the second sub-pixel 220 and the second sub-pixel 220 as shown in FIG. 1), further another data line may be connected to odd-numbered ones of the sub-pixels 200 in the third sub-pixel column C3 and even-numbered ones of the sub-pixels 200 in the fourth sub-pixel column C4 (i.e., in sequence, the third sub-pixel 230 and the third sub-pixel 230 as shown in FIG. 1), further another data line may be connected to odd-numbered ones of the sub-pixels 200 in the fourth sub-pixel column C4 and even-numbered ones of the sub-pixels 200 in the fifth sub-pixel column C5 (i.e., in sequence, the first sub-pixel 210 and the first sub-pixel 210 as shown in FIG. 1), and so on, wherein the rest may be deduced by analogy. The above design may reduce the frequency of color switching, so that the effect of power saving may be achieved. According to this embodiment, one data line may be connected to the sub-pixels 200 in adjacent two sub-pixel columns alternately, in other words, adjacent sub-pixels in one sub-pixel column may be connected to different data lines.

Figure 2:
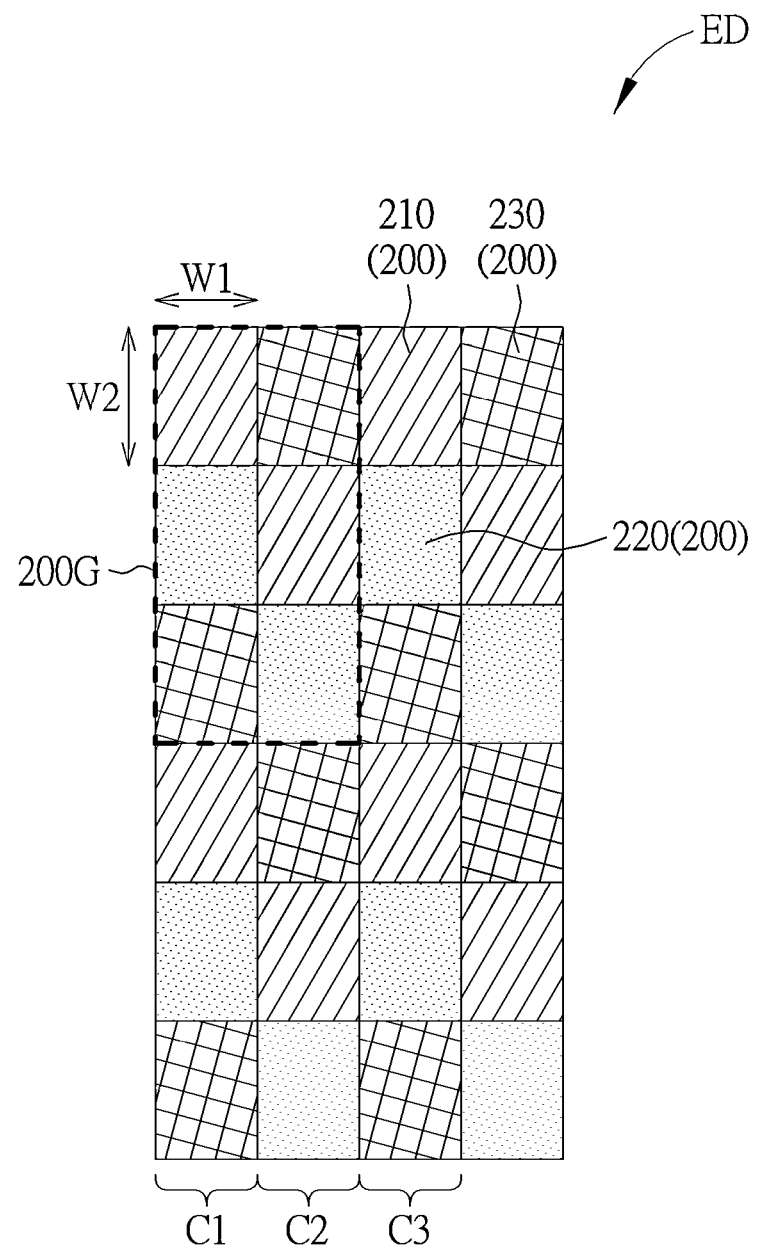
FIG. 2 is a partial top-view schematic diagram of a variant embodiment of an electronic device of a first embodiment according to the present disclosure.

Please refer to FIG. 2, which is a partial top-view schematic diagram of a variant embodiment of an electronic device of a first embodiment according to the present disclosure. In order to simplify the illustration, only a portion of the sub-pixel arrangement is shown in FIG. 2 and the following FIG. 3 to FIG. 15 and the substrate (refer to FIG. 1) is omitted therein. The arrangement of the sub-pixels 200 shown in FIG. 2 may be transposed from the color arrangement of the sub-pixels 200 shown in FIG. 1. The term "transpose" mentioned in the present disclosure may mean that rows and columns are interchanged. For example, the color arrangement of the sub-pixels 200 in the first row shown in FIG. 1 is converted into the color arrangement of the sub-pixels 200 in the first column shown in FIG. 2, and the color arrangement of the sub-pixels 200 in the second row shown in FIG. 1 is converted into the color arrangement of the sub-pixels 200 in the second column shown in FIG. 2, and so on, wherein the rest may be deduced by analogy. According to the embodiment shown in FIG. 2, the first width W1 of the sub-pixel 200 in the direction X is less than the second width W2 of the sub-pixel 200 in the direction Y, so that a number of the sub-pixels 200 disposed in the direction X may be greater than a number of the sub-pixels 200 disposed in the direction Y in the working region of the electronic device ED (taking a length of the working region in the direction X is equal to a length thereof in the direction Y as an example). That is to say, the number of sub-pixels 200 in one row extending along the direction X may be greater than the number of sub-pixels 200 in one column extending along the direction Y. The plurality of sub-pixels may include a pixel group 200G as a smallest repeating unit. The pixel group 200G may be composed of two first sub-pixels 210, two second sub-pixels 220 and two third sub-pixels 230. In the pixel group 200G, along the direction X, the first row may include the first sub-pixel 210 and the third sub-pixel 230 in sequence, the second row may include the second sub-pixel 220 and the first sub-pixel 210 in sequence, and the third row may include the third sub-pixel 230 and the second sub-pixel 220 in sequence, but not limited herein.

In some embodiments, the data lines may be connected to and drive the plurality sub-pixels 200 shown in FIG. 2 in a zigzag manner. Specifically, one data line may be connected to odd-numbered ones of the sub-pixels 200 in the first sub-pixel column C1 and even-numbered ones of the sub-pixels 200 in the second sub-pixel column C2 (i.e., in sequence, the first sub-pixel 210, the first sub-pixel 210, the third sub-pixel 230, the third sub-pixel 230, the second sub-pixel 220 and the second sub-pixel 220 as shown in FIG. 2), such that the frequency of the data line switching to different colors may be reduced, thereby achieving the effect of power saving. In addition, another data line may be connected to odd-numbered ones of the sub-pixels 200 in the second sub-pixel column C2 and even-numbered ones of the sub-pixels 200 in the third sub-pixel column C3 (i.e., in sequence, the third sub-pixel 230, the second sub-pixel 220, the second sub-pixel 220, the first sub-pixel 210, the first sub-pixel 210 and the third sub-pixel 230 as shown in FIG. 2), and so on, wherein the rest may be deduced by analogy, such that the frequency of color switching may be reduced and the electrical power is saved.

Figure 3:
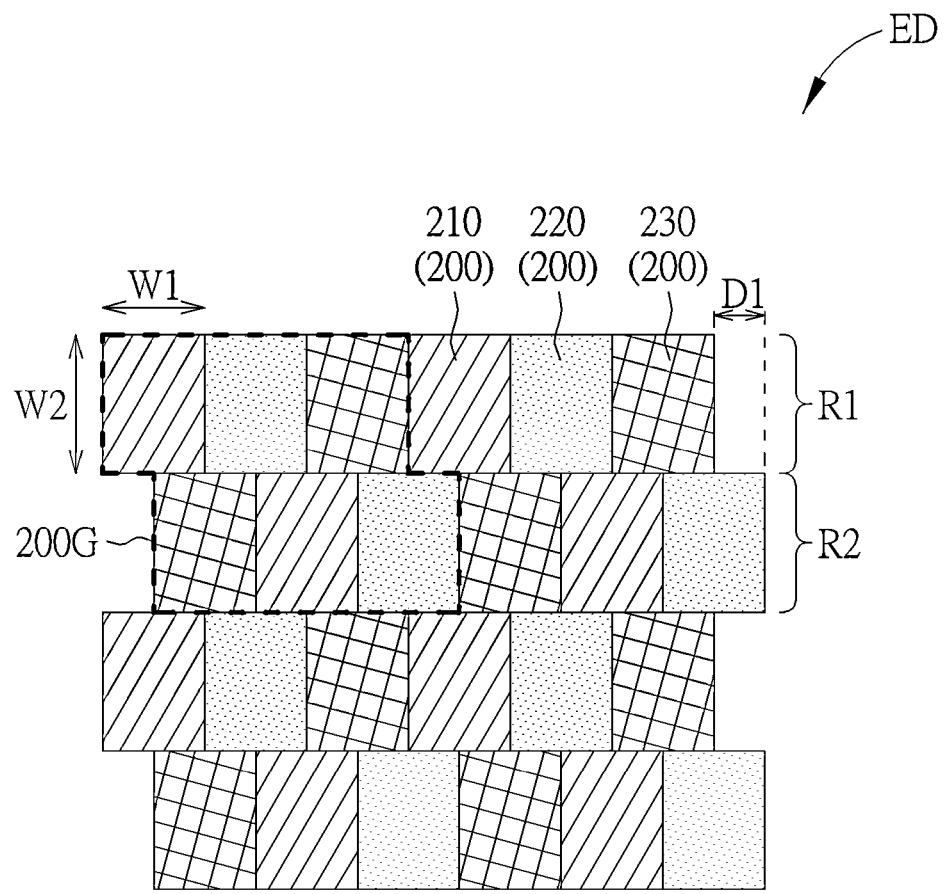
FIG. 3 is a partial top-view schematic diagram of another variant embodiment of an electronic device of a first embodiment according to the present disclosure.

Please refer to FIG. 3, which is a partial top-view schematic diagram of another variant embodiment of an electronic device of a first embodiment according to the present disclosure. According to the embodiment shown in FIG. 3, adjacent two sub-pixel rows are not aligned with each other. Specifically, an arrangement of the plurality of sub-pixels 200 may have a first sub-pixel row R1 and a second sub-pixel row R2 extending along the direction X, and the sub-pixels 200 in the first sub-pixel row R1 are not aligned with the sub-pixels 200 in the second sub-pixel row R2. The adjacent two sub-pixel rows (e.g., the first sub-pixel row R1 and the second sub-pixel row R2) may be shifted (or misaligned) by a first distance D1 in the direction X, wherein the first distance D1 may be the shortest distance measured from an edge of one of the sub-pixel rows (e.g., the first sub-pixel row R1) to the same side edge of adjacent another one of the sub-pixel rows (e.g., the second sub-pixel row R2) in the direction X. For example, the first distance D1 may be half of the first width W1 of the sub-pixel 200, but not limited herein. Through the above design that the sub-pixels 200 in adjacent two sub-pixel rows are arranged in a horizontal misalignment design, the thin film transistors correspondingly connected to the sub-pixels 200 are not aligned, so that the distance between the thin film transistors is increased, thereby improving the process feasibility, product yield and/or resolution. The plurality of sub-pixels 200 may include a pixel group 200G as a smallest repeating unit (indicated by the dotted-line frame shown in FIG. 3).

Figure 4:
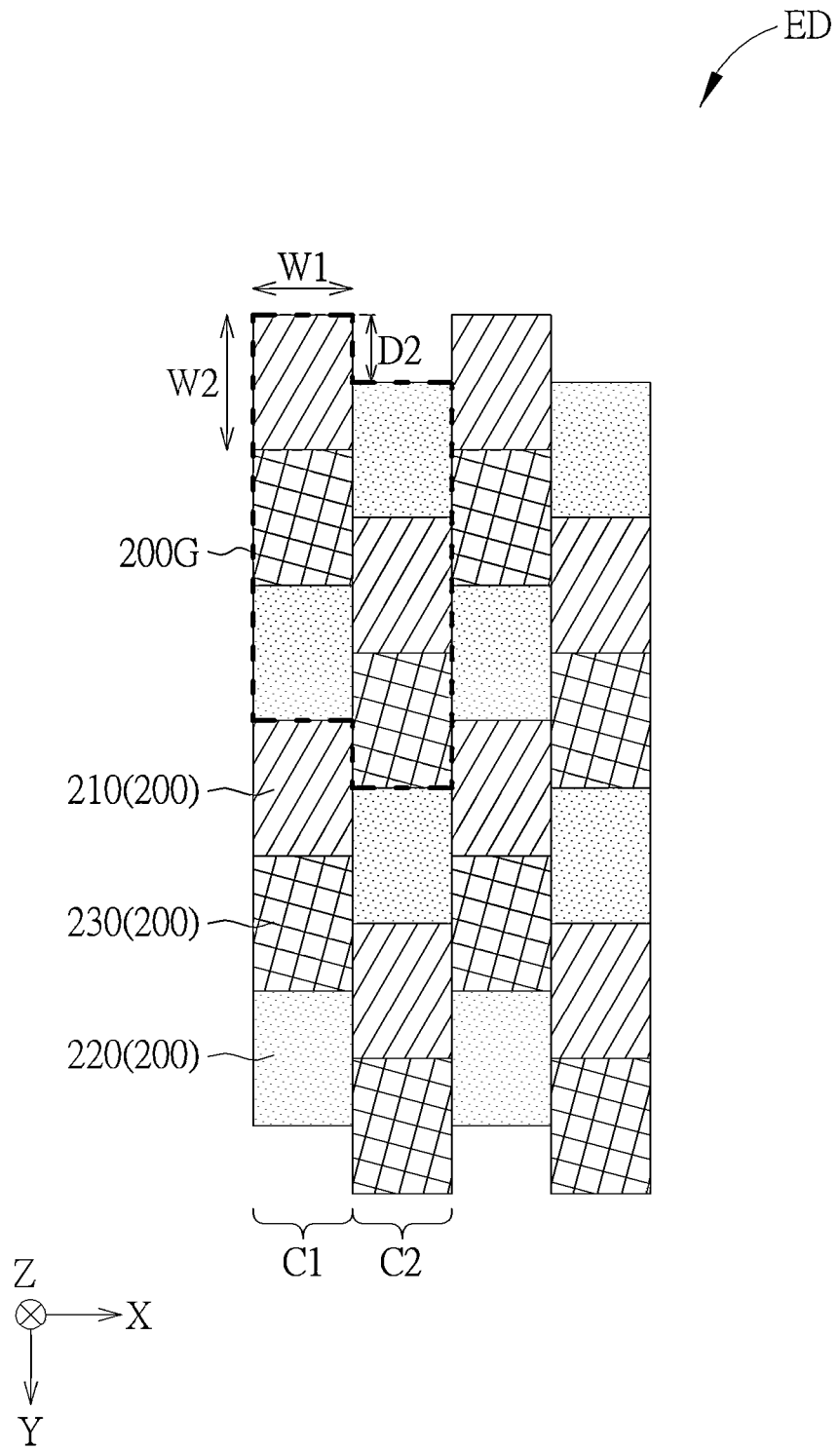
FIG. 4 is a partial top-view schematic diagram of an electronic device according to a second embodiment of the present disclosure.

Please refer to FIG. 4, which is a partial top-view schematic diagram of an electronic device according to a second embodiment of the present disclosure. According to the embodiment shown in FIG. 4, adjacent two sub-pixel columns are not aligned with each other. Specifically, an arrangement of the plurality of sub-pixels 200 may have a first sub-pixel column C1 and a second sub-pixel column C2 extending along the direction Y, and the sub-pixels 200 in the first sub-pixel column C1 are not aligned with the sub-pixels 200 in the second sub-pixel column C2. The adjacent two sub-pixel columns (e.g., the first sub-pixel column C1 and the second sub-pixel column C2) may be shifted (or misaligned) by a second distance D2 in the direction Y, wherein the second distance D2 may be the shortest distance measured from an edge of one of the sub-pixel columns (e.g., the first sub-pixel column C1) to the same side edge of adjacent another one of the sub-pixel columns (e.g., the second sub-pixel column C2) in the direction Y. For example, the second distance D2 may be half of the second width W2 of the sub-pixel 200, but not limited herein. The plurality of sub-pixels 200 may include a pixel group 200G as a smallest repeating unit (indicated by the dotted-line frame shown in FIG. 4).

Figure 5:
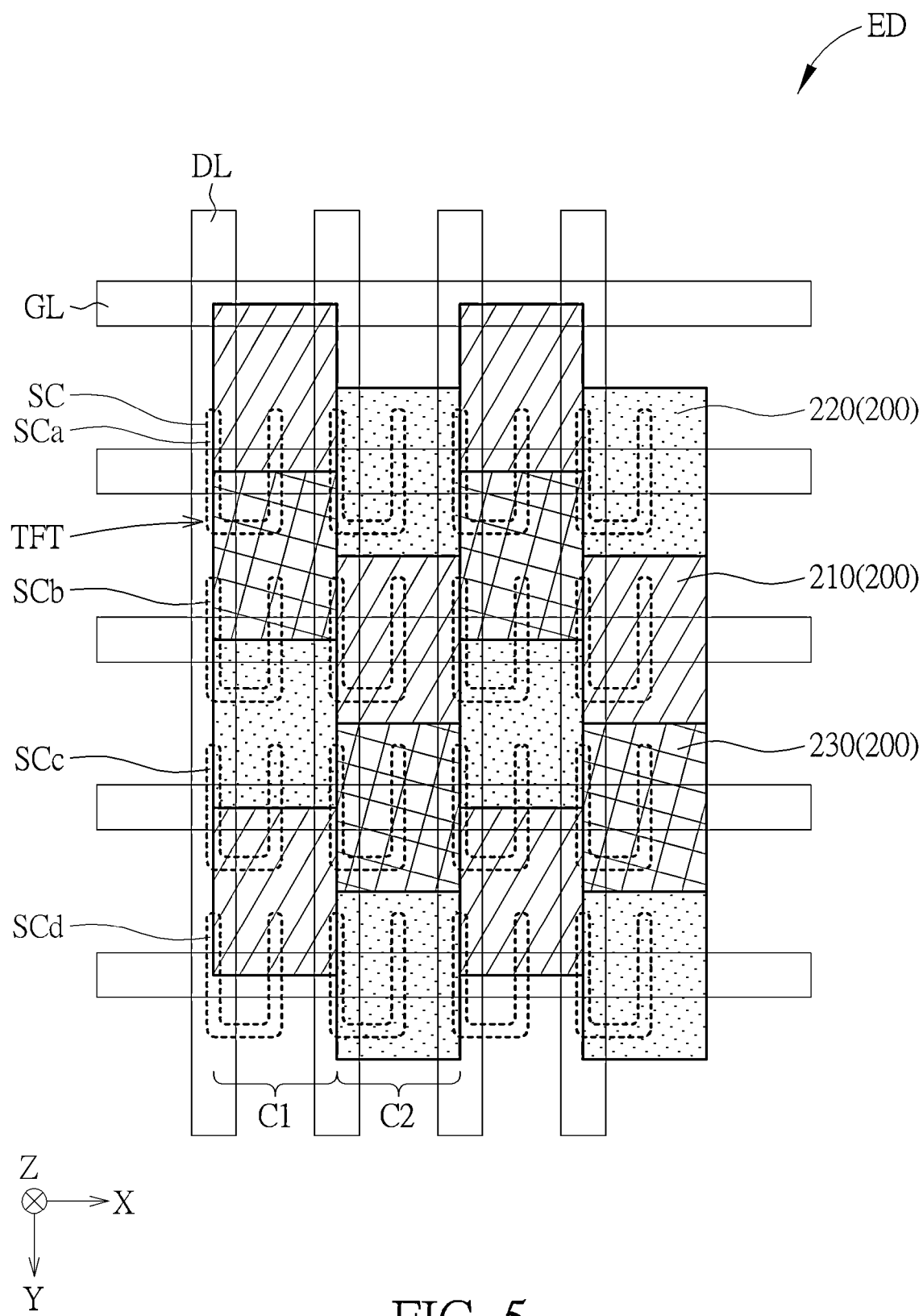
FIG. 5 to FIG. 8 are partial top-view schematic diagrams of some variant embodiments of an electronic device of a second embodiment according to the present disclosure.

Some variant embodiments of the electronic device ED with the design that the sub-pixels 200 of adjacent two sub-pixel columns are vertically misaligned are described in detail in the following. Please refer to FIG. 5 to FIG. 8. FIG. 5 to FIG. 8 are partial top-view schematic diagrams of some variant embodiments of an electronic device of a second embodiment according to the present disclosure. As shown in FIG. 5 to FIG. 8, an electronic device ED may include a plurality of sub-pixels 200, a plurality of scan lines GL, a plurality of data lines DL, a semiconductor layer SC that is patterned, and a plurality of thin film transistors TFT. The sub-pixels 200 of adjacent two sub-pixel columns (e.g., the first sub-pixel column C1 and the second sub-pixel column C2) are not aligned with each other, wherein the boundaries parallel to the direction X of the sub-pixels 200 are not aligned with each other. The scan line GL may generally extend along the direction X, and the data line DL may generally extend along the direction Y. The thin film transistor TFT may include a drain, a source, a gate, a semiconductor layer and a gate dielectric layer, wherein a portion of the scan line GL may form the gate of the thin film transistor TFT, a portion of the data line DL may form the source and/or the drain of the thin film transistor TFT, a portion of the semiconductor layer SC may form the semiconductor layer of the thin film transistor TFT, and a region overlapped with the gate may serve as a channel region of the thin film transistor TFT. As shown in FIG. 5, the semiconductor layer SC may include a plurality of semiconductor patterns (e.g., a semiconductor pattern SCa, a semiconductor pattern SCb, a semiconductor pattern SCc and a semiconductor pattern SCd), and the semiconductor pattern may form the semiconductor layer of each thin film transistor TFT and may have a U-shaped pattern, for example, which has an opening facing upward, but not limited herein. Each of the sub-pixels 200 may be coupled to one of the thin film transistors TFT. For example, the thin film transistor TFT may be connected to the sub-pixel 200 one-to-one, but not limited herein.

According to the embodiment shown in FIG. 5, The pattern of each scan line GL may be parallel to the direction X, and the thin film transistors TFT are disposed in alignment with each other along the corresponding scan line GL in sequence. That is to say, the thin film transistors TFT are aligned with each other, so that the size of the channel region of the thin film transistors TFT is unchanged, thereby reducing the differences in electrical properties of the thin film transistors TFT. The above design that the pattern of each of the scan lines GL is linear and parallel to the direction X may make the electrical performance of the thin film transistors TFT more consistent. As shown in FIG. 5, for example, the semiconductor pattern SCa, the semiconductor pattern SCb, the semiconductor pattern SCc and the semiconductor pattern SCd may correspond to the first sub-pixel 210, the third sub-pixel 230, the second sub-pixel 220 and the first sub-pixel 210 in the first sub-pixel column C1 from the top to the bottom, and so on, wherein the rest may be deduced by analogy.

Figure 6:
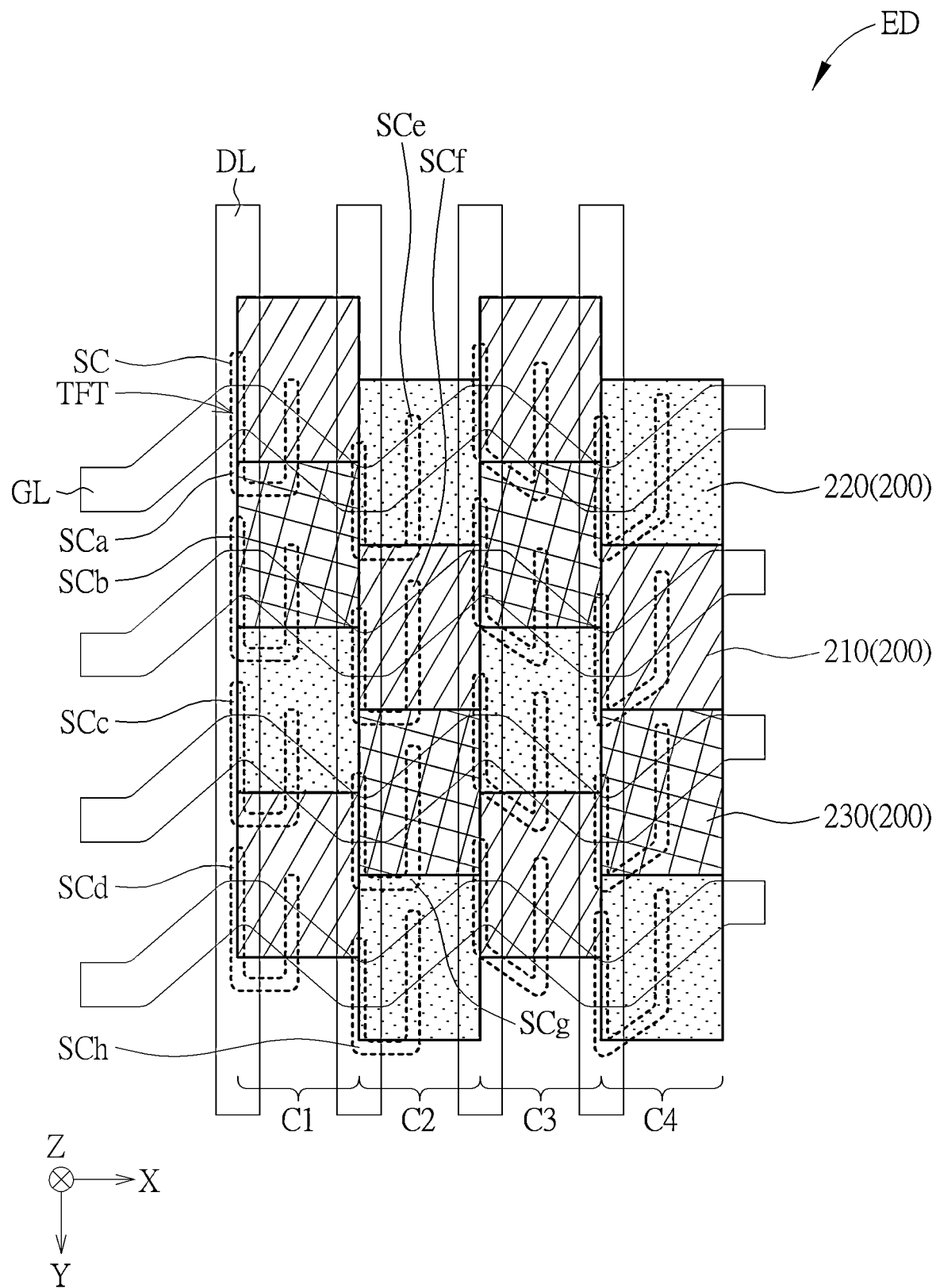

According to the embodiment shown in FIG. 6, the pattern of each scan line GL may be curved, and the thin film transistors TFT are misaligned vertically (i.e., in a up and down manner) in sequence along the corresponding scan line GL, so that each of the sub-pixel columns has the same aperture ratio. That is to say, an aperture ratio of the first sub-pixel column C1 is equal to an aperture ratio of the second sub-pixel column C2. The term "aperture ratio" referred in the present disclosure may mean the ratio of an area of the light-transmitting region of the sub-pixel to an area of the whole sub-pixel, wherein the light-transmitting region of the sub-pixel may be, for example, the region other than the opaque regions such as the wiring region and the transistor region. As shown in FIG. 6, for example, the semiconductor pattern SCa, the semiconductor pattern SCb, the semiconductor pattern SCc and the semiconductor pattern SCd may correspond to the first sub-pixel 210, the third sub-pixel 230, the second sub-pixel 220 and the first sub-pixel 210 in the first sub-pixel column C1 from the top to the bottom, and a semiconductor pattern SCe, a semiconductor pattern SCf, a semiconductor pattern SCg and a semiconductor pattern SCh may correspond to the second sub-pixel 220, the first sub-pixel 210, the third sub-pixel 230 and the second sub-pixel 220 in the second sub-pixel column C2 from the top to the bottom, and so on, wherein the rest may be deduced by analogy. In some embodiments, as shown in FIG. 6, a portion of the semiconductor patterns may have normal U-shaped patterns (e.g., the semiconductor patterns corresponding to the first sub-pixel column C1 and the second sub-pixel column C2), and another portion of the semiconductor patterns may have oblique U-shaped patterns (e.g., the semiconductor patterns corresponding to the third sub-pixel column C3 and the fourth sub-pixel column C4), but the semiconductor patterns of the present disclosure are not limited to the above. In other embodiments, all of the semiconductor patterns may have normal U-shaped patterns, or all of the semiconductor patterns may have oblique U-shaped patterns.

Figure 7:
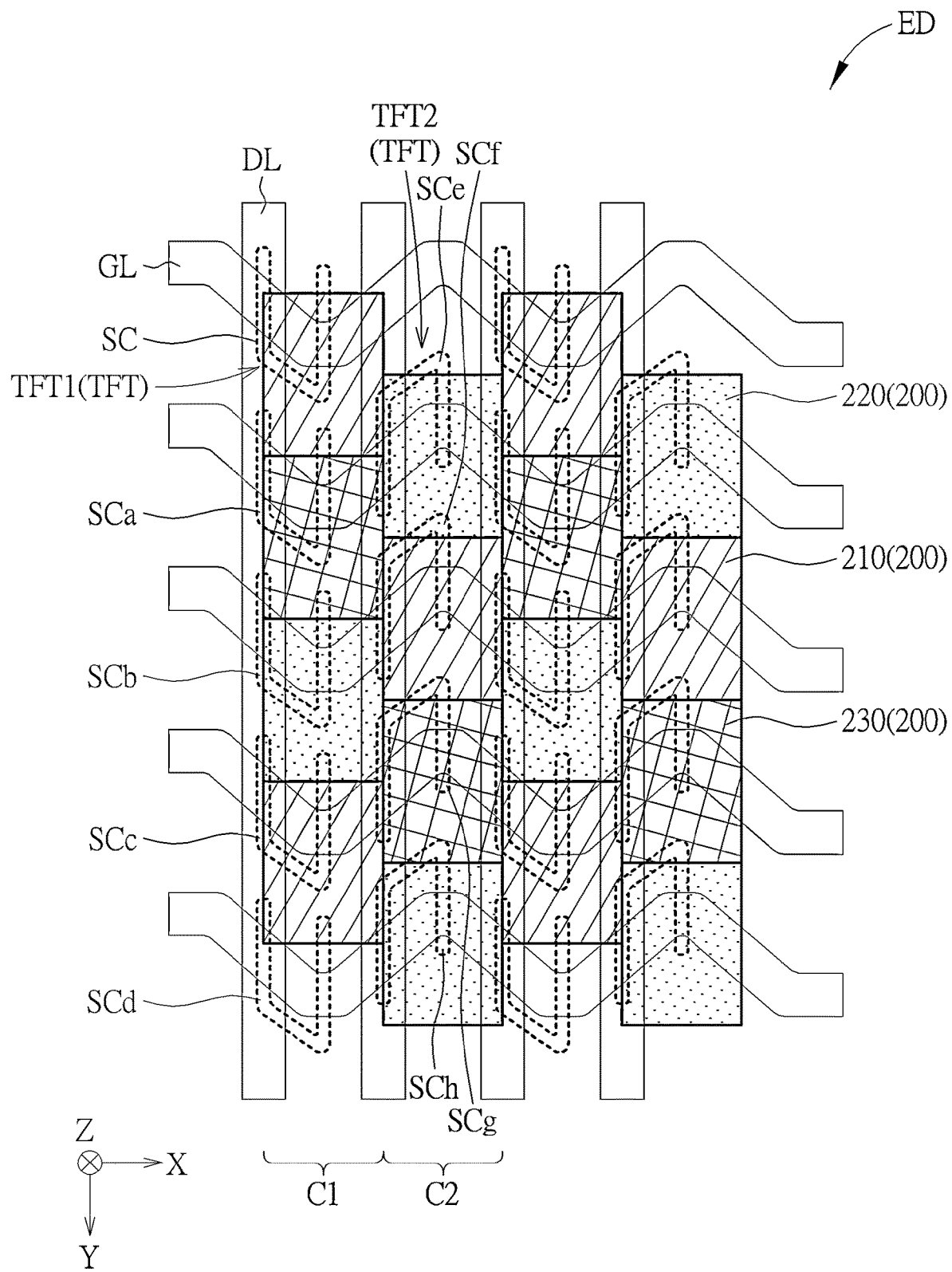

According to the embodiment shown in FIG. 7, the pattern of each scan line GL may be curved, and the thin film transistors TFT are not aligned with each other, so that each of the sub-pixel columns has the same aperture ratio. That is to say, an aperture ratio of the first sub-pixel column C1 is equal to an aperture ratio of the second sub-pixel column C2. Furthermore, a portion of the thin film transistors TFT may be flipped upside down, that is, the facing direction of the openings of each U-shaped pattern of the semiconductor layers of a portion of the thin film transistors TFT is opposite to the facing direction of the opening of each U-shaped pattern of the semiconductor layers of another portion of the thin film transistors TFT. For example, the thin film transistors TFT2 corresponding to the second sub-pixel column C2 may be flipped upside down, wherein the opening of each U-shaped pattern of the semiconductor layers of the thin film transistors TFT2 faces downward, while the thin film transistors TFT1 corresponding to the first sub-pixel column C1 are not flipped, wherein the opening of each U-shaped pattern of the semiconductor layers of the thin film transistors TFT1 faces upward. According to the above semiconductor patterns corresponding to the first sub-pixel column C1 and the second sub-pixel column C2, the designs at the source ends or the drain ends may be more consistent, such that the differences in electrical properties of the thin film transistors TFT may be further reduced. As shown in FIG. 7, for example, the semiconductor pattern SCa, the semiconductor pattern SCb, the semiconductor pattern SCc and the semiconductor pattern SCd may correspond to the first sub-pixel 210, the third sub-pixel 230, the second sub-pixel 220 and the first sub-pixel 210 in the first sub-pixel column C1 from the top to the bottom, and the semiconductor pattern SCe, the semiconductor pattern SCf, the semiconductor pattern SCg and the semiconductor pattern SCh may correspond to the second sub-pixel 220, the first sub-pixel 210, the third sub-pixel 230 and the second sub-pixel 220 in the second sub-pixel column C2 from the top to the bottom, and so on, wherein the rest may be deduced by analogy.

Figure 8:
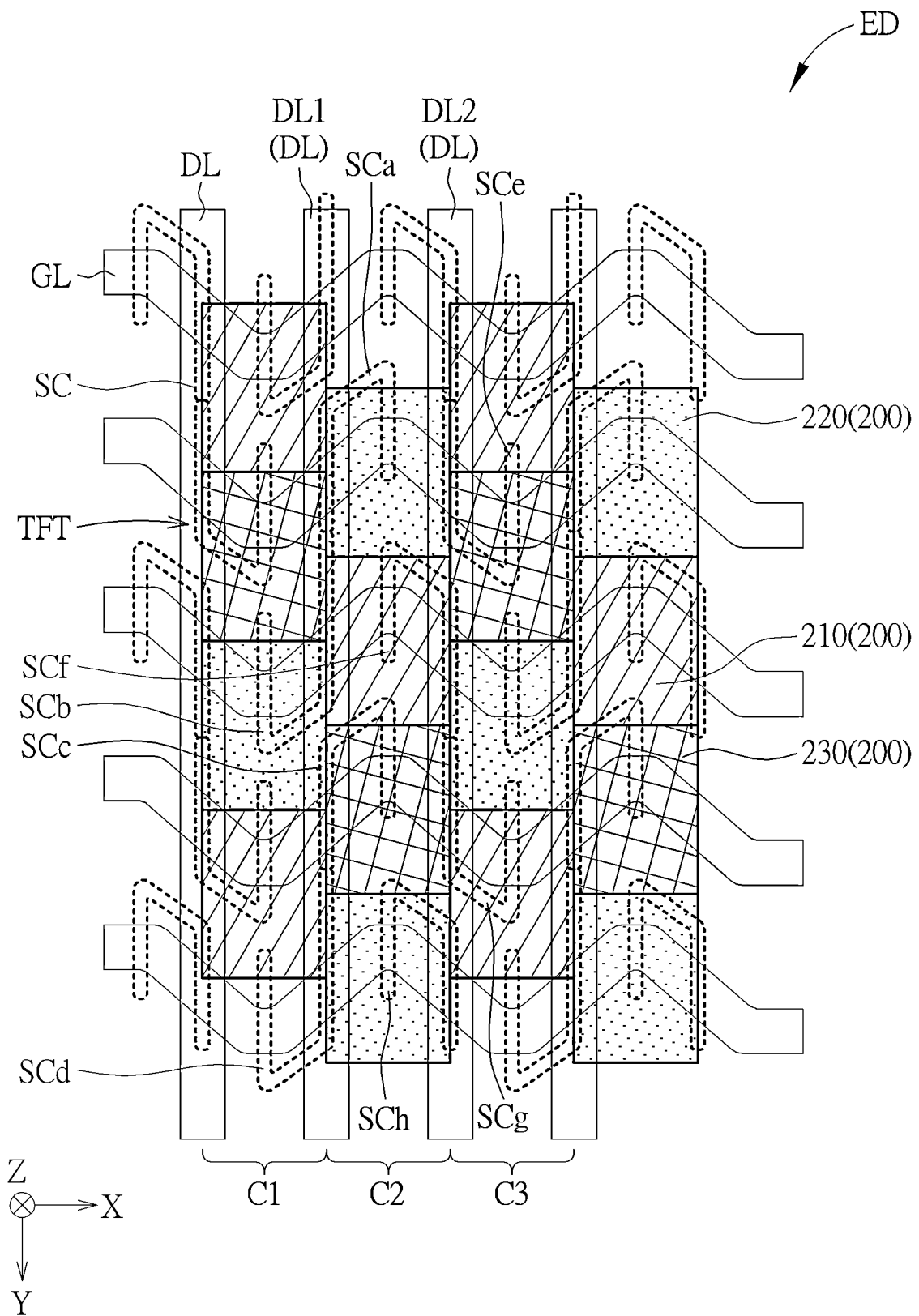

According to the embodiment shown in FIG. 8, the pattern of each scan line GL may be curved, and the thin film transistors TFT are not aligned with each other, so that each of the sub-pixel columns has the same aperture ratio. Furthermore, a portion of the thin film transistors TFT may be flipped, such that the differences in electrical properties of the thin film transistors TFT may be reduced. In addition, the data lines DL may be connected to and drive the sub-pixels 200 in a zigzag manner. Taking a data line DL1 shown in FIG. 8 as an example, the data line DL1 may be connected to at least one of the sub-pixels 200 in the first sub-pixel column C1 and at least one of the sub-pixels 200 in the second sub-pixel column C2. Specifically, the data line DL1 may be connected to odd-numbered ones of the sub-pixels 200 in the second sub-pixel column C2 and even-numbered ones of the sub-pixels in the first sub-pixel column C1 (i.e., in sequence, the second sub-pixel 220, the third sub-pixel 230, the third sub-pixel 230 and the first sub-pixel 210 as shown in FIG. 8, which corresponds to the semiconductor pattern SCa, the semiconductor pattern SCb, the semiconductor pattern SCc and the semiconductor pattern SCd respectively), and another data line DL2 may be connected to odd-numbered ones of the sub-pixels 200 in the third sub-pixel column C3 and even-numbered ones of the sub-pixels in the second sub-pixel column C2 (i.e., in sequence, the first sub-pixel 210, the first sub-pixel 210, the second sub-pixel 220 and the second sub-pixel 220 as shown in FIG. 8, which corresponds to the semiconductor pattern SCe, the semiconductor pattern SCf, the semiconductor pattern SCg and the semiconductor pattern SCh respectively), and so on, wherein the rest may be deduced by analogy, such that the frequency of the data lines DL switching to different colors may be reduced, thereby achieving the effect of power saving.

Figure 9:
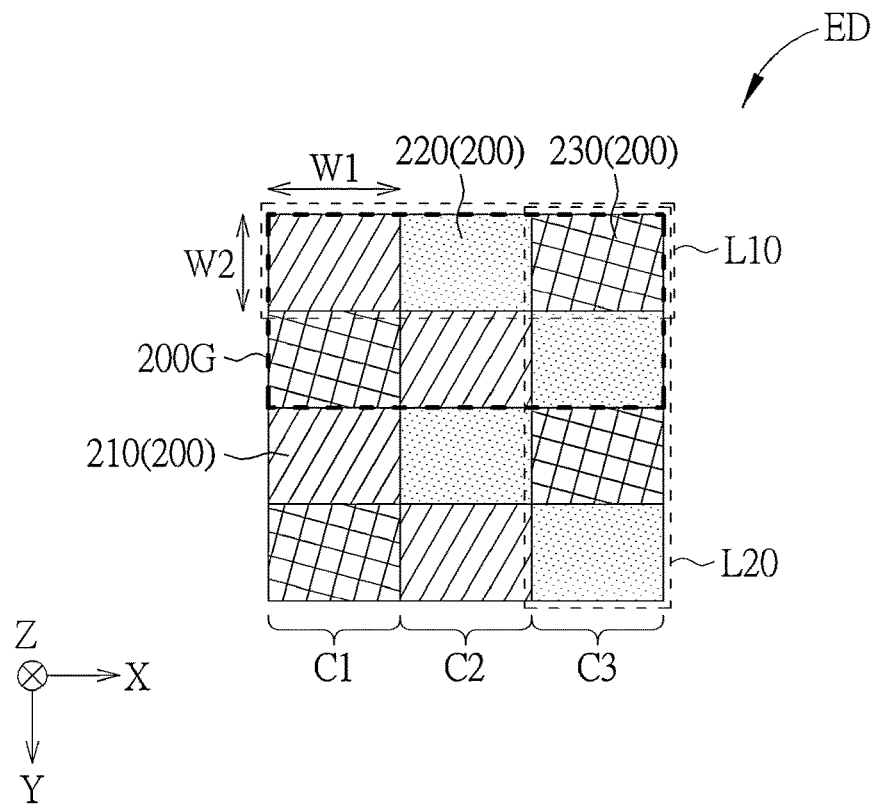
FIG. 9 is a partial top-view schematic diagram of an electronic device according to a third embodiment of the present disclosure.

Please refer to FIG. 9, which is a partial top-view schematic diagram of an electronic device according to a third embodiment of the present disclosure. As shown in FIG. 9, a plurality of sub-pixels 200 are arranged along the direction X and the direction Y, one of the sub-pixels 200 has a first width W1 in the direction X and a second width W2 in the direction Y. For example, the ratio of the first width W1 to the second width W2 may be 2:1.5, that is, the ratio of the first width W1 to the second width W2 may be 1.33, but not limited herein. Through the width design and arrangement of the sub-pixels 200 described above, more sub-pixels 200 may be disposed in the working region of the electronic device ED, thereby improving the resolution of the electronic device ED. According to the embodiment shown in FIG. 9, the second width W2 of the sub-pixel 200 in the direction Y is less than the first width W1 of the sub-pixel 200 in the direction X, so that a number of the sub-pixels 200 disposed in the direction Y may be greater than a number of the sub-pixels 200 disposed in the direction X in the working region of the electronic device ED. Specifically, an arrangement of the plurality of sub-pixels 200 may have a first line L10 extending along the direction X and a second line L20 extending along the direction Y, and a number of the sub-pixels 200 in the first line L10 is less than a number of the sub-pixels 200 in the second line L20. That is to say, the number of the sub-pixels 200 in one column extending along the direction Y may be greater than the number of the sub-pixels 200 in one row extending along the direction X. The plurality of sub-pixels 200 may include a pixel group 200G as a smallest repeating unit (indicated by the dotted-line frame shown in FIG. 9).

The scan lines (not shown in FIG. 9) disposed on the substrate of the electronic device ED may extend along the direction X, and the data lines disposed on the substrate of the electronic device ED may extend along the direction Y. According to the dual-channel design of the U-shaped semiconductor layer, it is necessary to have a certain distance between the source and the drain of the thin film transistor connected to the sub-pixel 200 in the direction X, so as to reduce the probability of short circuit between the channels. When the minimum or process limited channel width/spacing of the thin film transistor in the direction X is H micrometer(s) (µm), the minimum width of the sub-pixel 200 in the direction X needs to be 4 H micrometers for ensuring the widths of dual channels and the distance between the channels. When the channel length of the thin film transistor in the direction Y is V micrometer(s), the minimum width of the sub-pixel 200 in the direction Y only needs to be 2V micrometers (a distance of a channel length and a spacing), and the minimum width of the sub-pixel 200 in the direction Y may be further reduced by reducing the channel length of the thin film transistor in the direction Y. From the above, the width of the sub-pixel 200 in the direction X is limited by the design of the dual-channel thin film transistor, while the width of the sub-pixel 200 in the direction Y is not affected by the dual-channel design and it may be accepted to have a smaller size. Therefore, through the width design and arrangement of the sub-pixels 200 shown in FIG. 9, wherein the first width W1 of the sub-pixel 200 in the direction X is greater than the second width W2 of the sub-pixel 200 in the direction Y, it may be beneficial to the dual-channel design, thereby improving the process feasibility and product yield.

In some embodiments, the data lines may be connected to and drive the plurality sub-pixels 200 shown in FIG. 9 in a zigzag manner. Specifically, one data line may be connected to odd-numbered ones of the sub-pixels 200 in the first sub-pixel column C1 and even-numbered ones of the sub-pixels 200 in the second sub-pixel column C2 (i.e., in sequence, the first sub-pixel 210, the first sub-pixel 210, the first sub-pixel 210 and the first sub-pixel 210 as shown in FIG. 9), another data line may be connected to odd-numbered ones of the sub-pixels 200 in the second sub-pixel column C2 and even-numbered ones of the sub-pixels 200 in the third sub-pixel column C3 (i.e., in sequence, the second sub-pixel 220, the second sub-pixel 220, the second sub-pixel 220 and the second sub-pixel 220 as shown in FIG. 9), and so on, wherein the rest may be deduced by analogy, such that the frequency of the data line switching to different colors may be reduced, thereby achieving the effect of power saving.

Figure 10:
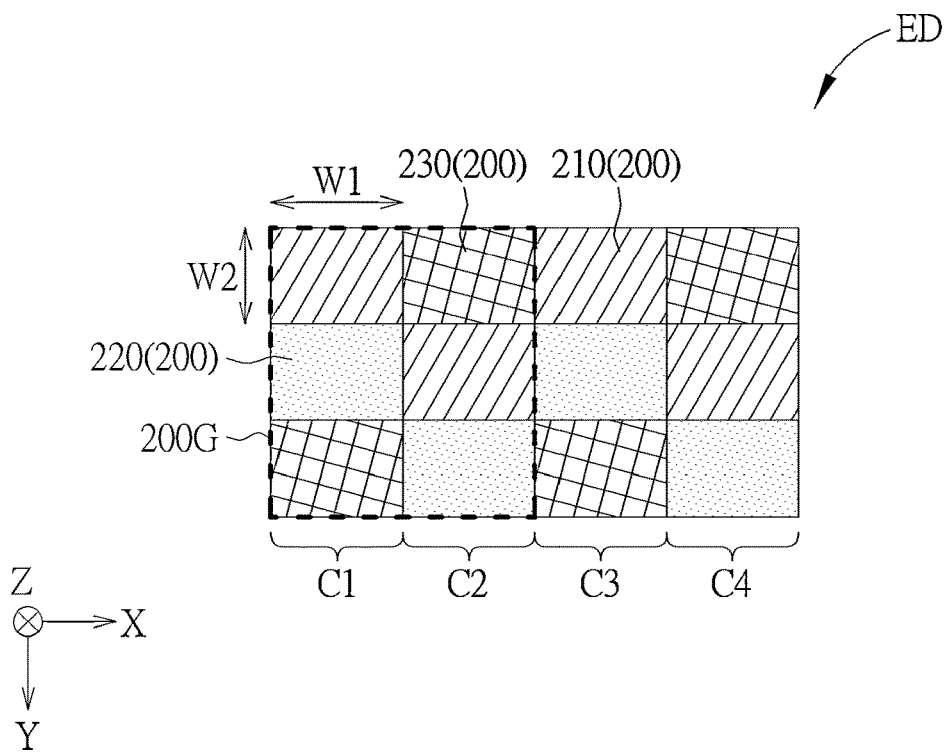
FIG. 10 is a partial top-view schematic diagram of a variant embodiment of an electronic device of a third embodiment according to the present disclosure.

Please refer to FIG. 10, which is a partial top-view schematic diagram of a variant embodiment of an electronic device of a third embodiment according to the present disclosure. The arrangement of the sub-pixels 200 shown in FIG. 10 may be transposed from the color arrangement of the sub-pixels 200 shown in FIG. 9. For example, the color arrangement of the sub-pixels 200 in the first row shown in FIG. 9 is converted into the color arrangement of the sub-pixels 200 in the first column shown in FIG. 10, and the color arrangement of the sub-pixels 200 in the second row shown in FIG. 9 is converted into the color arrangement of the sub-pixels 200 in the second column shown in FIG. 10, and so on, wherein the rest may be deduced by analogy. According to the embodiment shown in FIG. 10, the second width W2 of the sub-pixel 200 in the direction Y is less than the first width W1 of the sub-pixel 200 in the direction X, so that a number of the sub-pixels 200 disposed in the direction Y may be greater than a number of the sub-pixels 200 disposed in the direction X in the working region of the electronic device ED. That is to say, the number of the sub-pixels 200 in one column extending along the direction Y may be greater than the number of the sub-pixels 200 in one row extending along the direction X. The plurality of sub-pixels 200 may include a pixel group 200G as a smallest repeating unit (indicated by the dotted-line frame shown in FIG. 10).

In some embodiments, the data lines may be connected to and drive the plurality sub-pixels 200 shown in FIG. 10 in a zigzag manner. Specifically, one data line may be connected to odd-numbered ones of the sub-pixels 200 in the first sub-pixel column C1 and even-numbered ones of the sub-pixels 200 in the second sub-pixel column C2 (i.e., in sequence, the first sub-pixel 210, the first sub-pixel 210 and the third sub-pixel 230 as shown in FIG. 10), another data line may be connected to odd-numbered ones of the sub-pixels 200 in the second sub-pixel column C2 and even-numbered ones of the sub-pixels 200 in the third sub-pixel column C3 (i.e., in sequence, the third sub-pixel 230, the second sub-pixel 220 and the second sub-pixel 220 as shown in FIG. 10), still another data line may be connected to odd-numbered ones of the sub-pixels 200 in the third sub-pixel column C3 and even-numbered ones of the sub-pixels 200 in the fourth sub-pixel column C4 (i.e., in sequence, the first sub-pixel 210, the first sub-pixel 210 and the third sub-pixel 230 as shown in FIG. 10), and so on, wherein the rest may be deduced by analogy, such that the frequency of the data line switching to different colors may be reduced, thereby achieving the effect of power saving.

Figure 11:
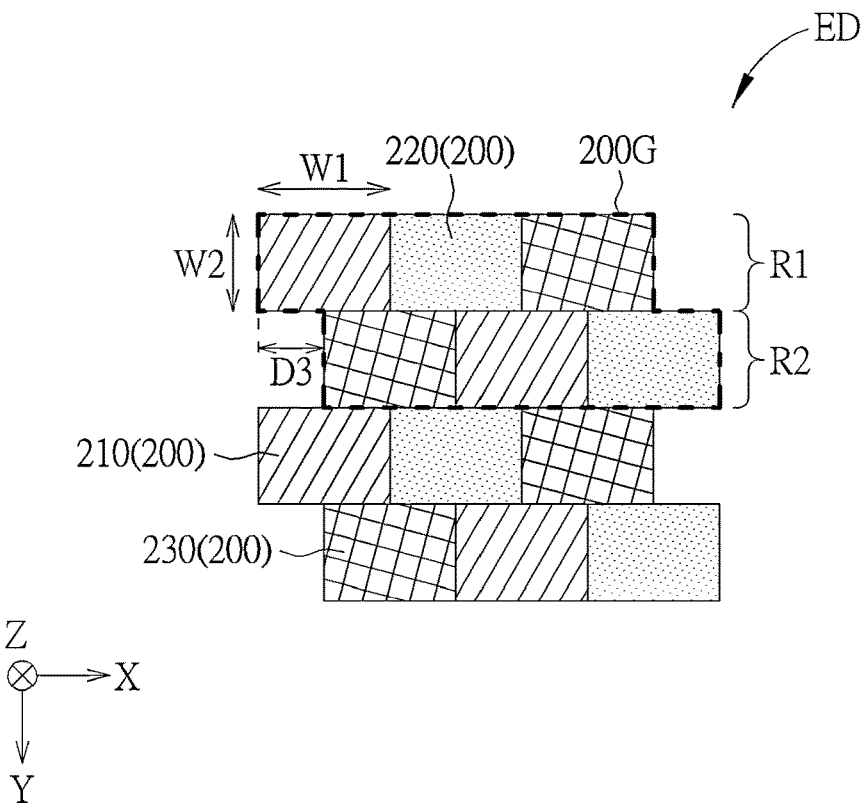
FIG. 11 is a partial top-view schematic diagram of another variant embodiment of an electronic device of a third embodiment according to the present disclosure.

Please refer to FIG. 11, which is a partial top-view schematic diagram of another variant embodiment of an electronic device of a third embodiment according to the present disclosure. According to the embodiment shown in FIG. 11, adjacent two sub-pixel rows are not aligned with each other. Specifically, an arrangement of the plurality of sub-pixels 200 may have a first sub-pixel row R1 and a second sub-pixel row R2 extending along the direction X, and the sub-pixels 200 in the first sub-pixel row R1 are not aligned with the sub-pixels 200 in the second sub-pixel row R2. The adjacent two sub-pixel rows (e.g., the first sub-pixel row R1 and the second sub-pixel row R2) may be misaligned by a third distance D3 in the direction X, wherein the third distance D3 may be the shortest distance measured from an edge of one of the sub-pixel rows (e.g., the first sub-pixel row R1) to the same side edge of adjacent another one of the sub-pixel rows (e.g., the second sub-pixel row R2) in the direction X. For example, the third distance D3 may be half of the first width W1 of the sub-pixel 200, but not limited herein. Through the above design that the sub-pixels 200 in adjacent two sub-pixel rows are horizontally misaligned, the thin film transistors correspondingly connected to the sub-pixels 200 are not aligned, so that the distance between the thin film transistors is increased, thereby improving the process feasibility and product yield. The plurality of sub-pixels 200 may include a pixel group 200G as a smallest repeating unit (indicated by the dotted-line frame shown in FIG. 11).

Figure 12:
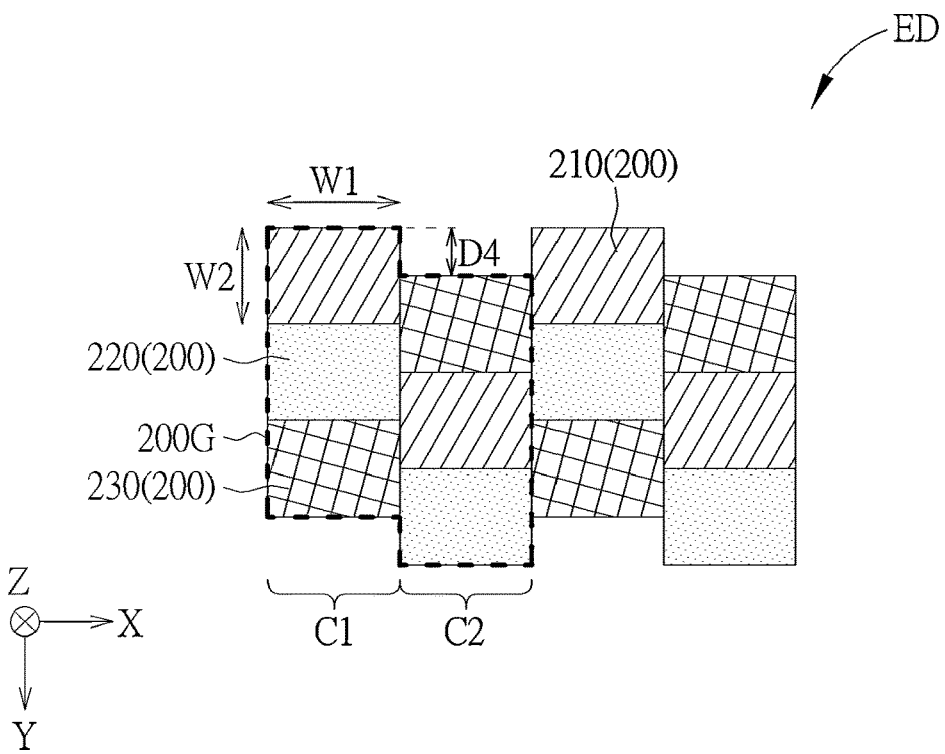
FIG. 12 is a partial top-view schematic diagram of still another variant embodiment of an electronic device of a third embodiment according to the present disclosure.

Please refer to FIG. 12, which is a partial top-view schematic diagram of still another variant embodiment of an electronic device of a third embodiment according to the present disclosure. According to the embodiment shown in FIG. 12, adjacent two sub-pixel columns are not aligned with each other. Specifically, an arrangement of the plurality of sub-pixels 200 may have a first sub-pixel column C1 and a second sub-pixel column C2 extending along the direction Y, and the sub-pixels 200 in the first sub-pixel column C1 are not aligned with the sub-pixels 200 in the second sub-pixel column C2. The adjacent two sub-pixel columns (e.g., the first sub-pixel column C1 and the second sub-pixel column C2) may be misaligned by a fourth distance D4 in the direction Y, wherein the fourth distance D4 may be the shortest distance measured from an edge of one of the sub-pixel columns (e.g., the first sub-pixel column C1) to the same side edge of adjacent another one of the sub-pixel columns (e.g., the second sub-pixel column C2) in the direction Y. For example, the fourth distance D4 may be half of the second width W2 of the sub-pixel 200, but not limited herein. The plurality of sub-pixels 200 may include a pixel group 200G as a smallest repeating unit (indicated by the dotted-line frame shown in FIG. 12).

The design that the sub-pixels 200 in adjacent two sub-pixel columns are vertically misaligned or shifted shown in FIG. 12 may be further cooperated with the design of the extension direction of the scan lines GL, the design that the thin film transistors TFT are not aligned, the thin film transistors TFT are flipped and/or the data lines DL are connected to and drive the sub-pixels 200 in a zigzag manner as shown in FIG. 5 to FIG. 8 in the previous embodiments, so as to achieve the corresponding effects, which are not described redundantly herein.

Figure 13:
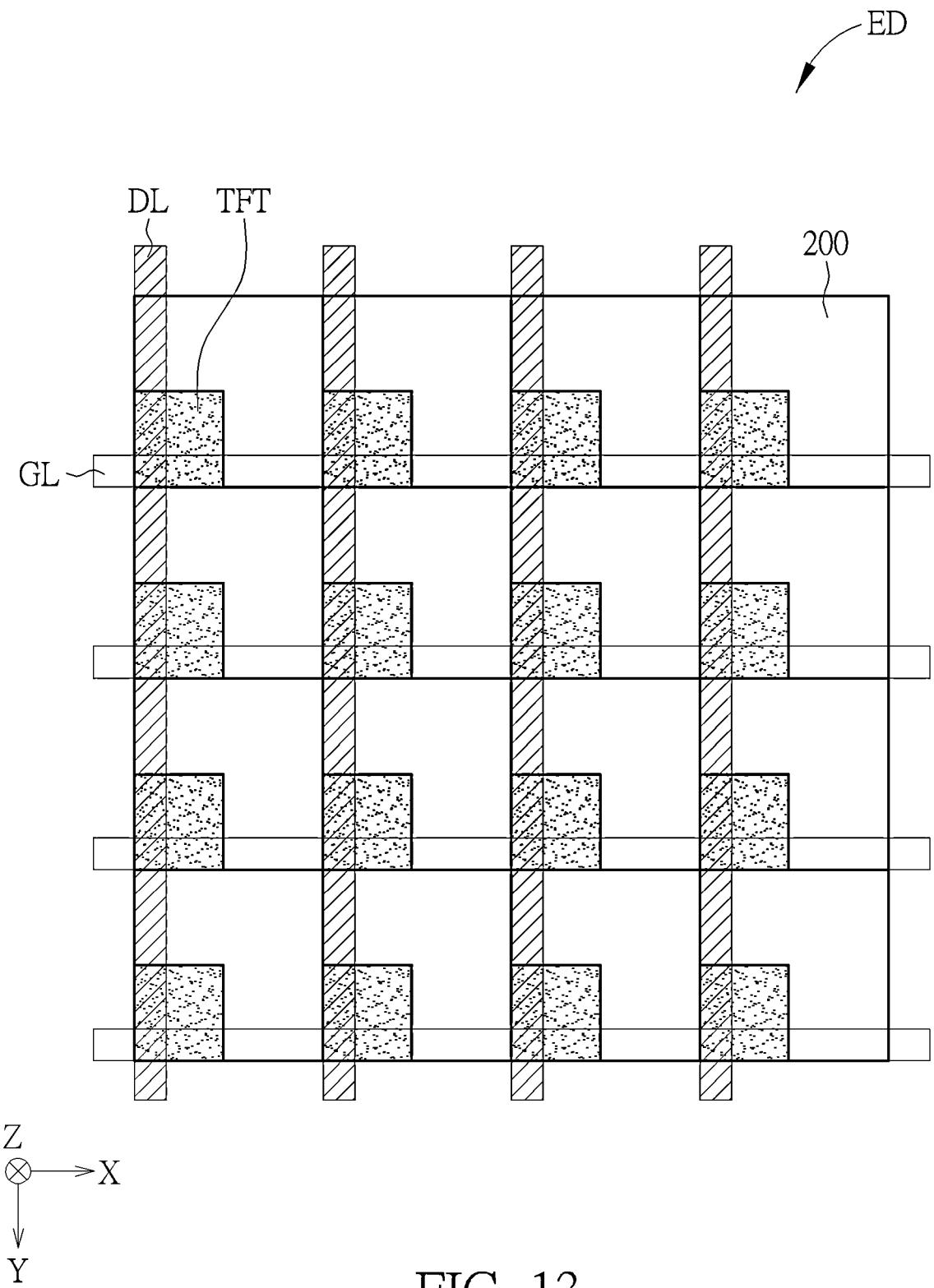
FIG. 13 is a partial top-view schematic diagram of an electronic device according to a fourth embodiment of the present disclosure.

Please refer to FIG. 13, which is a partial top-view schematic diagram of an electronic device according to a fourth embodiment of the present disclosure. As shown in FIG. 13, the plurality of sub-pixels 200 may have different colors in time sequence, that is, the electronic device ED may include a field sequential color (FSC) system. For example, the electronic device ED may include a backlight unit including a red light-emitting element, a green light-emitting element and a blue light-emitting element, which may make each sub-pixel 200 have different colors at different times, without disposing a color filter additionally. According to the embodiment shown in FIG. 13, the electronic device ED may include a plurality of scan lines GL extending along the direction X, a plurality of data lines DL extending along the direction Y and a plurality of thin film transistors TFT, and each of the sub-pixels 200 may be coupled to one of the thin film transistors TFT. The detailed structure of the thin film transistor TFT may be referred to the previous embodiments, which are not described redundantly herein.

Figure 14:
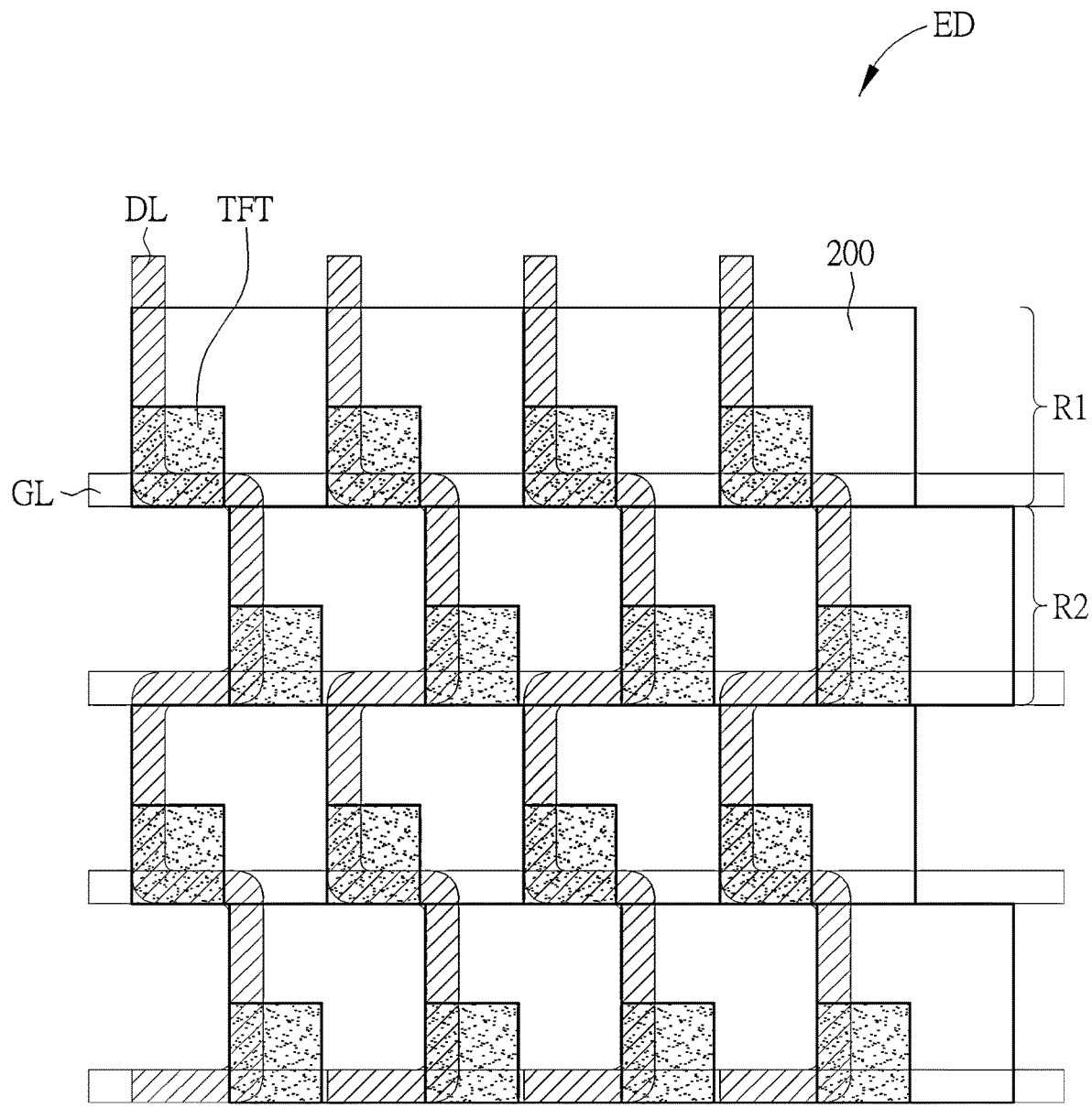
FIG. 14 is a partial top-view schematic diagram of a variant embodiment of an electronic device of a fourth embodiment according to the present disclosure.

Please refer to FIG. 14, which is a partial top-view schematic diagram of a variant embodiment of an electronic device of a fourth embodiment according to the present disclosure. According to the embodiment shown in FIG. 14, adjacent two sub-pixel rows are not aligned with each other. Specifically, an arrangement of the plurality of sub-pixels 200 may have a first sub-pixel row R1 and a second sub-pixel row R2 extending along the direction X, and the sub-pixels 200 in the first sub-pixel row R1 are not aligned with the sub-pixels 200 in the second sub-pixel row R2. For example, the sides of adjacent sub-pixels 200 parallel to the direction Y in the same column are misaligned with each other in the left to right direction. Through the above design that the sub-pixels 200 in adjacent two sub-pixel rows are horizontally misaligned, the thin film transistors correspondingly connected to the sub-pixels 200 are not aligned, so that the distance between the thin film transistors is increased, thereby improving the process feasibility and product yield. As shown in FIG. 14, the pattern of each scan line GL may be linear and parallel to the direction X, and the pattern of each data line DL may extend generally along the direction Y and have a curved portion.

Figure 15:
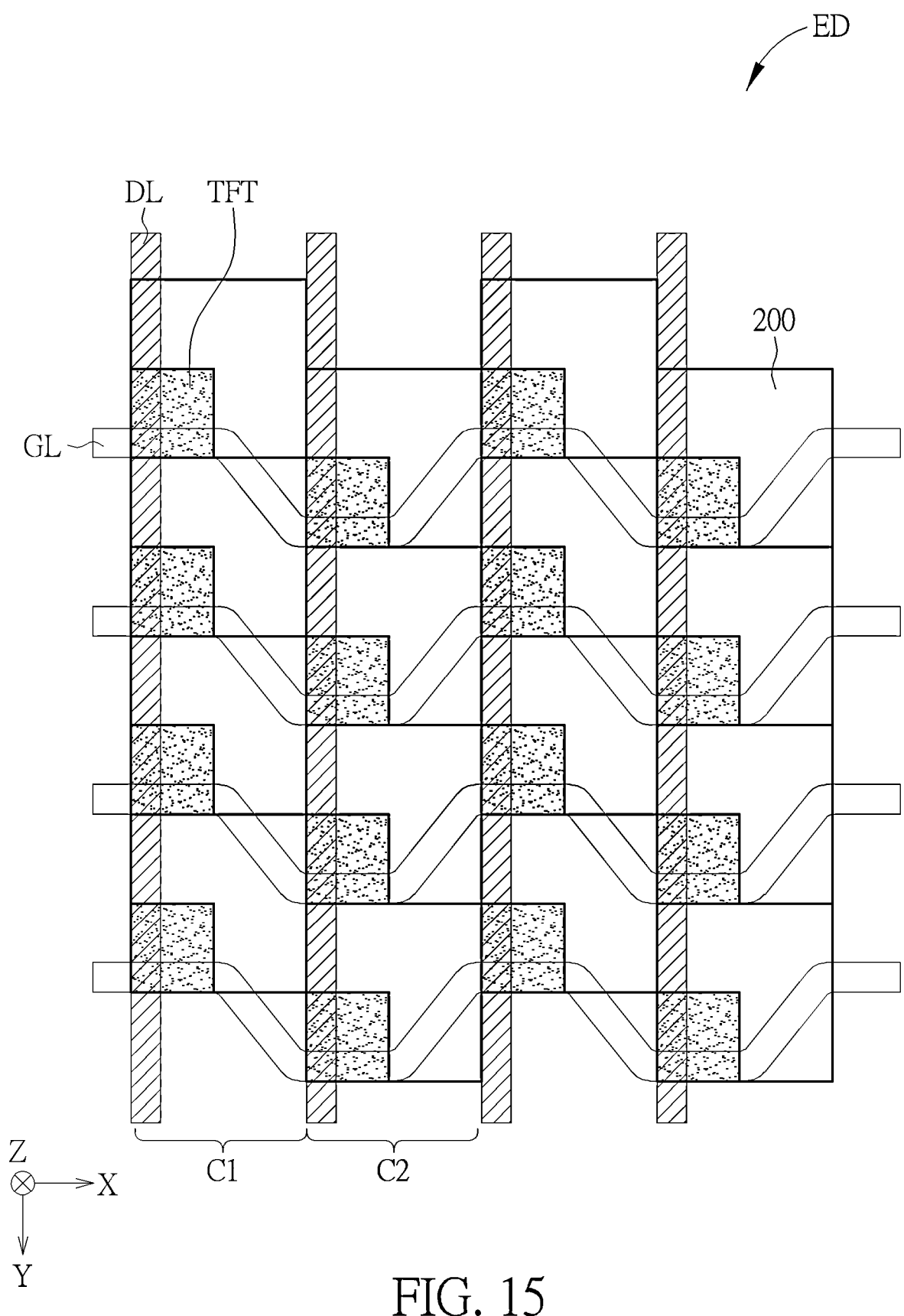
FIG. 15 is a partial top-view schematic diagram of another variant embodiment of an electronic device of a fourth embodiment according to the present disclosure.

Please refer to FIG. 15, which is a partial top-view schematic diagram of another variant embodiment of an electronic device of a fourth embodiment according to the present disclosure. According to the embodiment shown in FIG. 15, adjacent two sub-pixel columns are not aligned with each other. Specifically, an arrangement of the plurality of sub-pixels 200 may have a first sub-pixel column C1 and a second sub-pixel column C2 extending along the direction Y, and the sub-pixels 200 in the first sub-pixel column C1 are not aligned with the sub-pixels 200 in the second sub-pixel column C2. For example, the sides of adjacent sub-pixels 200 parallel to the direction X in the same row are misaligned with each other in the up to down direction. Through the above design that the sub-pixels 200 in adjacent two sub-pixel columns are vertically misaligned, the thin film transistors TFT correspondingly connected to the sub-pixels 200 may be located at different horizontal lines, so that the opaque region is less obvious and blurred, thereby improving the visibility of the electronic device ED. As shown in FIG. 15, the pattern of each data line DL may be linear and parallel to the direction Y, and the pattern of each scan line GL may extend generally along the direction X and have a curved portion.

From the above description, according to the electronic devices of the embodiments of the present disclosure, through sub-pixel rendering (SPR) technology such as the specific design and arrangement of the sub-pixels, the resolution, process feasibility and/or product yield of the electronic device may be improved. Furthermore, through the design that the data lines are connected to and drive the plurality sub-pixels in a zigzag manner, the effect of saving electrical power may be achieved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
    a substrate;
    a plurality of sub-pixels disposed on the substrate, wherein the plurality of sub-pixels are arranged along a first direction and a second direction, and the first direction is different from the second direction; and
    a plurality of thin film transistors disposed on the substrate, wherein each of the plurality of sub-pixels is coupled to at least one of the plurality of thin film transistors,
    wherein one of the plurality of sub-pixels has a first width in the first direction and a second width in the second direction, and a ratio of the first width to the second width is greater than 0.66 and less than 1.5,
    wherein each of the plurality of thin film transistors comprises a gate and a semiconductor layer, a portion of the semiconductor layer overlapped with the gate is defined as a channel region, and the second width is at least twice a length of the channel region in the second direction.

2. The electronic device according to claim 1, wherein an arrangement of the plurality of sub-pixels has a first line extending along the first direction and a second line extending along the second direction, and a number of the sub-pixels in the first line is greater than a number of the sub-pixels in the second line.

3. The electronic device according to claim 1, wherein an arrangement of the plurality of sub-pixels has a first line extending along the first direction and a second line extending along the second direction, and a number of the sub-pixels in the first line is less than a number of the sub-pixels in the second line.

4. The electronic device according to claim 1, wherein an arrangement of the plurality of sub-pixels has a first sub-pixel row and a second sub-pixel row, and the sub-pixels in the first sub-pixel row are not aligned with the sub-pixels in the second sub-pixel row.

5. The electronic device according to claim 4, wherein the first sub-pixel row and the second sub-pixel row are shifted by a first distance in the first direction.

6. The electronic device according to claim 5, wherein the first distance is half of the first width.

7. The electronic device according to claim 1, wherein an arrangement of the plurality of sub-pixels has a first sub-pixel column and a second sub-pixel column, and the sub-pixels in the first sub-pixel column are not aligned with the sub-pixels in the second sub-pixel column.

8. The electronic device according to claim 7, wherein an aperture ratio of the first sub-pixel column is equal to an aperture ratio of the second sub-pixel column.

9. The electronic device according to claim 8, further comprising a data line disposed on the substrate and extending along the second direction, wherein the data line is connected to at least one of the sub-pixels in the first sub-pixel column and at least one of the sub-pixels in the second sub-pixel column.

10. The electronic device according to claim 7, wherein the first sub-pixel column and the second sub-pixel column are shifted by a second distance in the second direction.

11. The electronic device according to claim 10, wherein the second distance is half of the second width.

12. The electronic device according to claim 1, further comprising a scan line disposed on the substrate and extending along the first direction.

13. The electronic device according to claim 12, further comprising a data line disposed on the substrate and extending along the second direction.

14. The electronic device according to claim 13, wherein an arrangement of the plurality of sub-pixels has a first sub-pixel column and a second sub-pixel column, and the data line is connected to odd-numbered ones of the sub-pixels in the first sub-pixel column and even-numbered ones of the sub-pixels in the second sub-pixel column.

15. The electronic device according to claim 1, wherein the plurality of sub-pixels are divided into a plurality of pixel groups.

16. The electronic device according to claim 15, wherein each of the pixel group comprises a first sub-pixel, a second sub-pixel and a third sub-pixel arranged in sequence in a first row of the pixel group, and another third sub-pixel, another first sub-pixel and another second sub-pixel arranged in sequence in a second row of the pixel group.

17. The electronic device according to claim 15, wherein each of the pixel group comprises a first sub-pixel and a third sub-pixel arranged in sequence in a first row of the pixel group, a second sub-pixel and another first sub-pixel arranged in sequence in a second row of the pixel group, and another third sub-pixel and another second sub-pixel arranged in sequence in a third row of the pixel group.

18. The electronic device according to claim 1, wherein the semiconductor layer of each of the plurality of thin film transistors has a U-shaped pattern.

19. The electronic device according to claim 18, wherein an opening of the U-shaped pattern of the semiconductor layer of one of the plurality of thin film transistors faces toward a direction opposite to an opening of the U-shaped pattern of the semiconductor layer of another one of the plurality of thin film transistors.

20. The electronic device according to claim 1, wherein the plurality of sub-pixels have different colors in time sequence.

* * * * *